US010743441B1

(12) United States Patent
Gardner et al.

(10) Patent No.: US 10,743,441 B1
(45) Date of Patent: Aug. 11, 2020

(54) REMOTE CONTROLLED FLOOR TILE SYSTEM

(71) Applicant: Amazon Technologies, Inc., Reno, NV (US)

(72) Inventors: Brock Robert Gardner, Seattle, WA (US); Michael Phillip Czamara, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 1232 days.

(21) Appl. No.: 14/018,278

(22) Filed: Sep. 4, 2013

(51) Int. Cl.
*H05K 7/20* (2006.01)

(52) U.S. Cl.
CPC ............... *H05K 7/20754* (2013.01)

(58) Field of Classification Search
CPC .................................. H05K 7/20754
USPC ........................................ 454/184
See application file for complete search history.

(56) References Cited

U.S. PATENT DOCUMENTS

| 8,939,824 B1* | 1/2015 | Bash ................ H05K 7/20181 361/679.51 |
| 2007/0125107 A1* | 6/2007 | Beam ................ F24F 11/0012 62/186 |
| 2007/0135032 A1* | 6/2007 | Wang ........................ F24F 9/00 454/184 |
| 2009/0031148 A1* | 1/2009 | Densham ................ G06F 1/189 713/300 |
| 2009/0043415 A1* | 2/2009 | Sun .................... G05B 19/4183 700/117 |
| 2009/0293518 A1* | 12/2009 | Bettella .................... F04D 25/12 62/186 |
| 2011/0244779 A1* | 10/2011 | Ohba .................... F24F 11/0001 454/184 |
| 2012/0003918 A1* | 1/2012 | McReynolds ....... F24F 13/1426 454/313 |
| 2012/0156981 A1* | 6/2012 | Curtin ................ H05K 7/20836 454/184 |

OTHER PUBLICATIONS

David Stenftenagel "Underfloor Air Distribution Systems" US Department of Energy, downloaded from www.seco.cpa.state.tx.usTEP_ProductiongTEPMtgsb5-york_09082004_14.pdf via wayback machine Nov. 20, 2007, pp. 1-42.

* cited by examiner

*Primary Examiner* — Steven B McAllister
*Assistant Examiner* — Allen R Schult
(74) *Attorney, Agent, or Firm* — Robert C. Kowert; Kowert, Hood, Munyomn, Rankin & Goetzel, P.C.

(57) ABSTRACT

A remote-controlled data center floor tile of a raised floor plenum is adjustable by a remote control system to selectively direct air supplied from the raised floor plenum to cool particular rack computing systems in a data center. Floor tiles can include one or more remote-controlled flow control elements that can be independently adjusted to different particular configurations to direct air to one or more specific targets. A remote control system can independently adjust various flow control elements configurations in a network of various floor tiles to manage environmental conditions in a data center, including mitigating localized temperature hotspots at particular portions of a rack computing system. Hotspot mitigation can involve responding to detection of a hotspot at a target location by configuring one or more flow control elements to direct air supplied from the raised floor plenum to supply additional air to cool the target location.

16 Claims, 6 Drawing Sheets

REMOTE CONTROLLED FLOOR TILE SYSTEM

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many server racks. Each server rack, in turn, includes many servers and associated computer equipment.

Computer systems typically include a number of components that generate waste heat. Such components include printed circuit boards, mass storage devices, power supplies, and processors. For example, some computers with multiple processors may generate 250 watts of waste heat. Some known computer systems include a plurality of such larger, multiple-processor computers that are configured into rack-mounted components, and then are subsequently positioned within a rack computing system. Some known rack computing systems include 40 such rack-mounted components and such rack computing systems will therefore generate as much as 10 kilowatts of waste heat. Moreover, some known data centers include a plurality of such rack computing systems.

Some known data centers include methods and apparatus that facilitate waste heat removal from rack systems. Such methods and apparatus can include a raised floor plenum, where one or more floor tiles supply air from the plenum to cool rack computing systems. Many existing methods and apparatus may not, however, provide air for cooling in an effective manner to where it is most needed. Moreover, some known data centers include multiple rack systems having configurations that are non-uniform with respect to component density and usage, such that each rack system generates waste heat at a non-uniform rate as compared to other rack systems. In such data centers, application of uniform heat removal methods and apparatus to such non-uniform waste heat generation sources may not be fully efficient and effective in waste heat removal.

Figure 1:
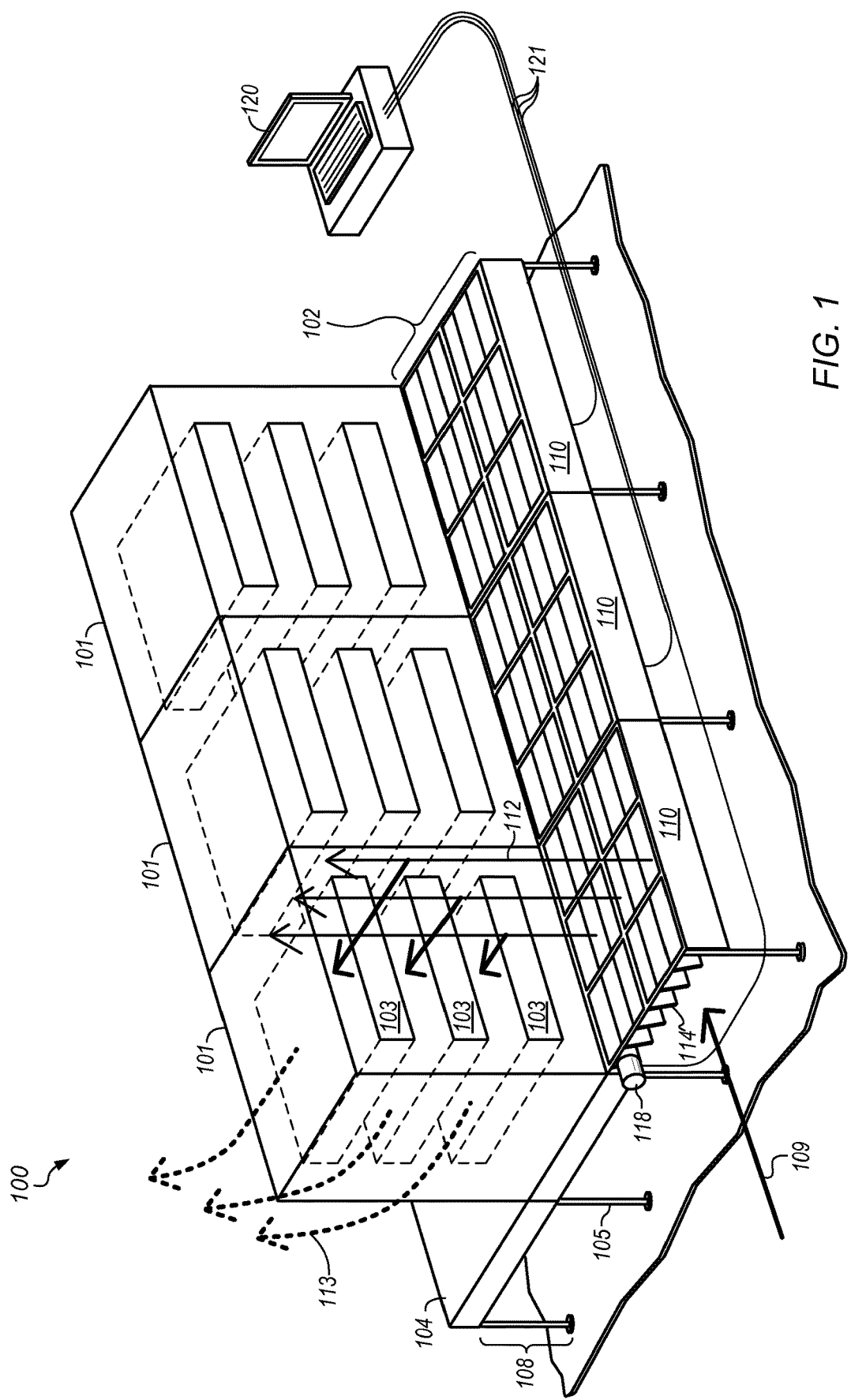
FIG. 1 illustrates a perspective view of a data center with a remote-controlled floor tile system according to one embodiment.

While embodiments are described herein by way of example for several embodiments and illustrative drawings, those skilled in the art will recognize that embodiments are not limited to the embodiments or drawings described. It should be understood, that the drawings and detailed description thereto are not intended to limit embodiments to the particular form disclosed, but on the contrary, the intention is to cover all modifications, equivalents and alternatives falling within the spirit and scope as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of remote-controlled floor tile systems, and systems and methods of managing flow of air to electrical systems are disclosed. According to one embodiment, a data center includes a row of rack computing systems, a cold aisle extending along the row, a raised floor plenum extending beneath the cold aisle, and a remote-controlled floor tile system that supplies air from the raised floor plenum to the rack computing systems. The remote-controlled floor tile system includes remote-controlled louver tiles located in the cold aisle that each include a louver that directs air from the raised floor plenum to the intake side of one or more rack computing systems and a tile remote control system that selectively adjusts particular louvers to direct air to one or more of the rack computing systems.

According to one embodiment, a system includes a computing device that can communicatively couple to floor tiles that themselves can direct air supplied from a raised floor plenum to an environment and command particular configurations of one or more particular floor tiles independently of the other floor tiles, so that the particularly configured floor tiles are independently configured to direct air to a particular region of the environment.

According to one embodiment, an apparatus includes a data center floor tile that includes an interface, an adjustable flow control element, and a motor coupled to the adjustable flow control element. The data center floor tile can couple to a raised floor plenum, so that the tile can supply air from the raised floor plenum to a computing system. The interface can communicatively couple to a tile control system. The adjustable flow control element can direct air supplied from the raised floor plenum to the computing system. The motor can adjust the adjustable flow control element based at least in part on a command signal received at the interface from the tile control system.

As used herein, "air distribution system" means a system that provides or moves air to, or removes air from, one or more systems or components.

As used herein, an "aisle" means a space next to one or more racks.

As used herein, "ambient" refers to a condition of outside air at the location of a system or data center.

As used herein, "computing" includes any operations that can be performed by a computer, such as computation, data storage, data retrieval, or communications.

As used herein, "computing device" includes any of various devices in which computing operations can be carried out, such as computer systems or components thereof. One example of a computing device is a rack-mounted server. As used herein, the term computing device is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. Some examples of computing devices include e-commerce servers, network devices, telecommunications equipment, medical equipment, electrical power management and control devices, and professional audio equipment (digital, analog, or combinations thereof). In various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, "data center" includes any facility or portion of a facility in which computer operations are carried out. A data center may include servers dedicated to specific functions or serving multiple functions. Examples of computer operations include information processing, communications, simulations, and operational control.

As used herein, "data center module" means a module that includes, or is suitable for housing and/or physically supporting, one or more computer systems that can provide computing resources for a data center.

As used herein, to "direct" air includes directing or channeling air, such as to a region or point in space.

As used herein, a "duct" includes any device, apparatus, element, or portion thereof, that can direct, segregate, or channel a fluid, such as air. Examples of ducts include cloth or fabric ducts, sheet metal ducts, molded ducts, tubes, or pipes. The cross sectional shape of a passageway of a duct may be square, rectangular, round or irregular, and may be uniform or change over the length of the duct. A duct may be a separately produced component or integral with one or more other components, such as a frame.

As used herein, a "flow control element" includes any device, apparatus, element, or portion thereof, having one or more airflow control members that control or regulate passage of a fluid, such as air, through one or more outlets or other openings. A flow control element may include, for example, a louver. Airflow control members of a flow control element may be adjustable, fixed, or a combination thereof.

As used herein, a "louver" includes a flow control element, or portion thereof, having one or more slats, fins, vanes, panels, or other airflow control members that control or regulate passage of air through one or more slots or other openings. A louver may include, for example, a set of mutually parallel, horizontal fins. Airflow control members of a louver may be adjustable, fixed, or a combination thereof.

As used herein, to "mitigate" means to reduce the severity of, or risk of damage from, something, such as a load, phenomenon, anomaly, or event.

As used herein, a "module" is a component or a combination of components physically coupled to one another. A module may include functional elements and systems, such as computer systems, racks, blowers, ducts, power distribution units, fire suppression systems, and control systems, as well as structural elements, such a frame, housing, or container. In some embodiments, a module is pre-fabricated at a location off-site from a data center.

As used herein, a "motor" means a machine that can convert energy into mechanical motion. Examples of motors include an electrical motor, a pneumatic motor, a hydraulic motor, a servomotor, a piezoelectric motor, an ultrasonic motor, an actuator, a linear actuator, a belt drive, and a chain drive.

As used herein, a "rack" means a rack, container, frame, or other element or combination of elements that can contain or physically support one or more computer systems.

As used herein, "rack computing system" means a system that includes one or more computing devices mounted in a rack.

As used herein, "remote control" refers to management of one or more functions, components, or the like of one or more systems, apparatuses, devices, or the like by some or all of one or more external control systems, apparatuses, devices, or the like. A remote control system that is configured to manage one or more functions of a device may be located adjacent the device, locally to the device, remotely to the device in a common facility, in a separate facility, or some combination thereof.

As used herein, "room" means a room or a space of a building. As used herein, "computing room" means a room of a building in which computing devices, such as rack-mounted servers, can be operated.

As used herein, a "space" means a space, area or volume.

As used herein, a "tile" means a piece of material that can be used in to form or cover a floor, wall, or ceiling of a room. Examples of a tile include a plate, slab, or sheet. A tile may be made of made of any material. Examples of materials for a tile include metal, plastic, composite, gypsum, ceramic, stone, fiberglass, or combinations thereof. A tile may have any suitable shape. A tile may include one or more flow control elements, which may be located at the upper surface of the tile, under a cover element, or the like, that enable a fluid such as air to be communicated between two or more environments through at least a portion of the tile and directed to a particular region or location in an environment. Examples of shapes for a tile include square, rectangular, hexagonal, or irregular.

As used herein, a "louver tile", "louvered tile", "louver floor tile", "louvered floor tile", and the like refers to a tile that includes one or more louvers that enable a fluid such as air to be communicated between two or more environments through at least a portion of the tile. One or more louvers in a louver tile may be independently adjustable by one or more control systems, which may include remote control systems.

As used herein, a "perforated tile", "perforated floor tile", and the like refers to a tile that includes one or more perforations that enable a fluid such as air to be communicated between two or more environments through at least a portion of the tile.

In various embodiments, a remote-controlled floor tile system includes one or more floor tiles in a raised floor that include adjustable flow control elements that can be independently adjusted by a remote control system to selectively direct air supplied from a raised floor plenum to one or more particular regions in an environment. The remote control system may independently adjust several separate flow control elements in several separate tiles to one or more particular configurations to manage environmental conditions in the environment. The remote-controlled floor tile system may be configured to respond to detection of an environmental anomaly in the environment by independently configuring one or more flow control elements to mitigate the anomaly by directing air to one or more particular regions.

FIG. 1 illustrates a perspective view of a data center with a remote-controlled floor tile system according to one embodiment. Data center 100 includes a row of rack computing systems 101 facing an aisle 102 on a raised floor 104 that includes remote-controlled floor tiles 110 that are at least partially managed by remote control system 120.

Data center 100 includes rack computing systems 101 arranged in a row, such that each rack computing system 101 faces an aisle 102 that extends along the row. A rack computing system 101 may include one or more computing systems 103 that generate waste heat during operation. In some embodiments, aisle 102 is a "cold aisle" from which air is supplied to the rack computing systems 101 to cool the various components therein by absorbing and removing waste heat from the rack computing systems 101.

In some embodiments, air supplied to the rack computing systems 101 from the cold aisle 102 is itself supplied to the cold aisle from one or more air distribution systems. For example, data center 100 may include an air distribution system that comprises a raised floor plenum 108. A raised floor 104 that is supported over a lower floor 106 by one or more support components 105, and upon which the rack computing systems 101 are located, cooperates with the lower floor 106 to form the raised floor plenum 108. Air 109 is supplied into the plenum 108, and the air 109 is supplied to the cold aisle 102 through one or more floor tiles 110 in the raised floor 104. In some embodiments, air 109 is supplied into the plenum from one or more air handling units.

In some embodiments, air supplied to the cold aisle from one or more floor tiles 110 is referred to as "cooling air" 112 and passes from the cold aisle 102 through some or all of the rack computing systems 101, including some or all of one or more computing systems 103. The air may absorb waste heat generated by various components as it passes through some or all of the rack computing systems 101 and exits the rack computing systems 101 as "exhaust air" 113. In some embodiments, the exhaust air 113 exits one or more rack computing systems 101 on a side opposite the side facing the cold aisle 102, where the side faces a "hot aisle" that includes components, including an exhaust vent (not shown in FIG. 1), that remove the exhaust air 113 from proximity to the rack computing systems 101. In some embodiments, the exhaust air 113 exits one or more rack computing systems 101 through one or more various sides, including a vent coupled to a top side of a rack computing system 101.

In some embodiments, one or more of the floor tiles 110 in the raised floor 104 includes one or more remote-controlled floor tiles that includes one or more flow control elements 114 that can be adjusted to particular configurations that direct air 112 supplied from the raised floor plenum 108 to one or more particular targets. For example, in the illustrated embodiment, raised floor tiles 110 include a flow control element 114 that can be adjusted to one or more configurations to direct air 112 to one or more particular portions of one or more of the rack computing system 101. A flow control element 114 may be configurable to direct air 112 to one or more particular computing systems 103 which may be adjacent to the floor tile 110 including the flow control element 114.

In some embodiments, a remote-controlled floor tile includes one or more flow control elements 114 that can be independently adjusted to independent configurations so that air 112 is directed to separate targets from each of the independently adjusted flow control elements 114. For example, a floor tile 110 may include two independently-controllable flow control elements 114 that can be independently adjusted to direct air 112 supplied from plenum 108 to two separate computing systems 103 in one or more separate rack computing systems 101.

In some embodiments, multiple flow control elements located in multiple floor tiles 110 are adjusted to a common configuration. The multiple flow control elements may include some or all flow control elements associated with a particular region in an environment. For example, a single aisle 102 may represent a region, such that all flow control elements 114 located in all floor tiles 110 in the aisle 110 are in the same region. Each of the flow control elements 114 in the region may be adjusted to a common configuration. In some embodiments, flow control elements 114 may be part of multiple different regions. For example, an entire data center room may be a first region, while individual aisles in the room may be individual second regions, such that each flow control element is part of both the first region and a particular second region. Furthermore, all of the flow control elements in the data center room may be adjusted to a common configuration based upon being in the first region. The flow control elements may, in addition, be adjusted to common configurations specific to their respective second regions.

In some embodiments, some of the flow control elements in multiple floor tiles are adjusted to a common configuration. For example, where a floor tile 110 includes top flow control elements and bottom flow control elements, each of the top flow control elements in each of the floor tiles 110 may be part of a first region, and each of the bottom flow control elements in each of the floor tiles in a region may be part of a second region.

In some embodiments, one or more flow control elements 114 are coupled to one or more motors 118 that can adjust the one or more flow control elements 114 to one or more configurations. For example, in the illustrated embodiment, motor 118 is configured to adjust the entire flow control element 114 to a particular configuration. In some embodiments, flow control elements 114 in separate floor tiles 110 are independently adjustable to independent configurations. For example, two separate floor tiles 110 located near a particular rack computing system 101 may include flow control elements 114 that are independently adjusted to two respectively independent configurations such that air supplied from plenum 108 through each of the two floor tiles 110 is directed to the same rack computing system.

In some embodiments, one or more remote-controlled floor tiles 110 are managed by one or more remote control systems 120 to direct air 112 towards one or more separate targets. In the illustrated embodiment, for example, each remote-controlled floor tile 110 is communicatively coupled to remote control system 120 by way of individual lines 121. In some embodiments, floor tiles 110 may be communicatively coupled to a network of floor tiles 110 that is communicatively coupled to remote control system 120. In some embodiments, lines 121 can include a wired connection, a wireless connection, or some combination thereof. Remote control system 120 may include one or more computer systems and may be located locally to the data center 100, remotely, or some combination thereof. For example, remote control system may include a wall-mounted control device in a common computing room as the rack computing systems 101 and floor tiles 110, where the control device adjusts one or more flow control elements 114 based upon user input commands via an interface. In another example, remote control system 120 may include a computing system that is at least partially located in a separate room in the data center, a separate one or more facilities, or the like.

In some embodiments, remote control system 120 manages some or all of one or more floor tiles 110 by commanding one or more components in the floor tiles 110 to perform certain functions. For example, in the illustrated embodiment, remote control system 120 may be communicatively coupled to one or more motors 118 in each floor tile 110 and may manage configurations of one or more flow control elements 114 in the floor tiles 110 by commanding one or more motors 118 to adjust the various flow control elements 114 to one or more particular configurations. Commands sent to a motor may include command signals that are processed, and instructions contained therein executed, by one or more components. In some embodiments, command may be electrical power transmitted to a motor 118 by way of a line 121 to power the motor 118.

In some embodiments, remote control system 120 manages various independent configurations of various flow control elements 114 of various floor tiles 110 to maintain environmental conditions in at least part of the data center within certain predetermined limits. For example, where rack computing systems 101 generate waste heat at a non-uniform rate due to non-uniform usage of computing capacity, remote control system 120 may adjust the amount of air 112 directed to some or all selected portions of each rack computing system 101 to maintain adequate cooling to maintain temperature conditions within limits. Remote control system 120 may respond to detection of temperature conditions at one or more portions of one or more rack computing systems 101 by adjusting one or more flow control elements 114 to adjust the flow rate of air supplied to particular portions of particular rack computing systems 101. For example, where a temperature hotspot is created at computing system 103 due to increased waste heat generation, remote control system 120 may detect the hotspot based at least in part on environmental data received from one or more sensors and re-configure various flow control elements 114 in various floor tiles 110 to increase the flow rate of air 112 to the computing system 103.

In some embodiments, flow control elements 114 in some floor tiles 110 may be configured to affect air flow through other floor tiles 110. For example, where remote control system 120 adjusts a flow control element in one floor tile to increase air flow to a computing system 103, the remote control system 120 may adjust another flow control element 114 in another floor tile to reduce airflow through the other floor tile 110 so that airflow through one or more other floor tiles is maintained. In some embodiments, the remote control system 120 may, in addition or in alternative, control some or all of one or more air handling units, including varying an air moving device (not shown) to adjust the flow rate of air in the plenum 108 to maintain airflow through some or all of the floor tiles.

For illustrative purposes, only three rack computing systems, three remote-controlled floor tiles, and one aisle are shown in FIG. 1. A data center 100 may, however, include any number of racks, aisles, and remote-controlled floor tiles.

Figure 2:
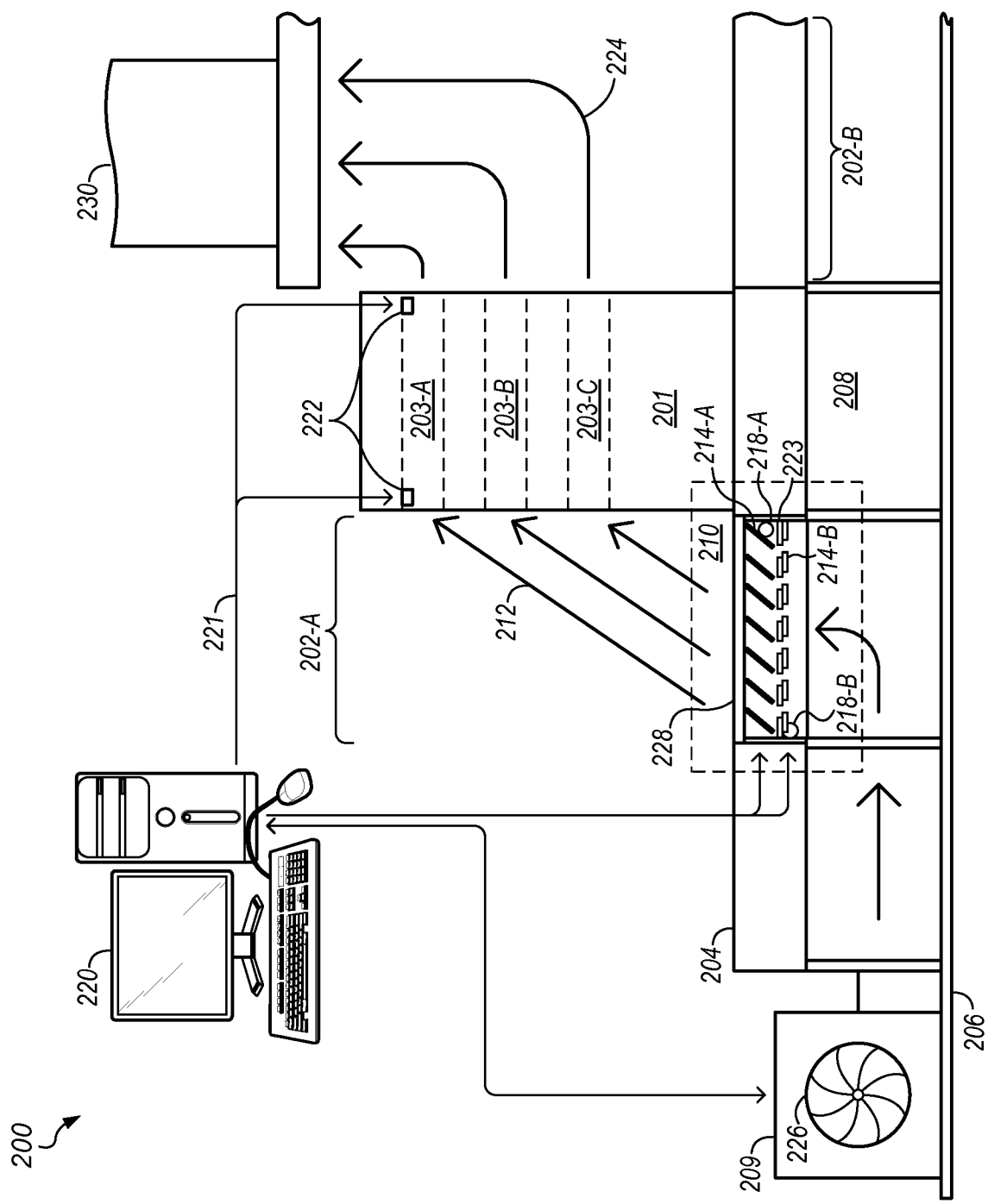
FIG. 2 illustrates a cross-section of a data center with a remote-controlled floor tile system according to one embodiment.

FIG. 2 illustrates a cross-section of a data center with a remote-controlled floor tile system according to one embodiment.

Data center 200 includes one or more rack computing systems 201, which may each include one or more computing systems 203A-C. Various portions of a rack computing system 201 may use air to cool various components by enabling air to pass through some or all of the rack computing system 201, absorbing and removing waste heat generated by various components of the rack computing system 201 in the process. In some embodiments, data center 200 includes various sensors that may collect data regarding various properties of the data center environment. For example, sensors 222 may include temperature sensors that collect data indicating temperatures within computing system 203-A at air intake and exhaust points. In another example, sensors 222 may include air sensors that collect data indicating one or more of air pressure, air humidity, air velocity, air volumetric flow rate, air mass flow rate, etc. The collected environmental data can be processed, in some embodiments, to make determinations regarding the environment in various locations of the data center, including determining whether a temperature hotspot is occurring or may occur in various locations. For example, data from sensors 222 may be processed to determine if a hotspot is or may occur in or near computing system 203-A. In some embodiments, sensors 222 may be located in various locations in data center 200, including in locations external to rack computing systems, in plenum 208, in raised floor 204, or the like.

Data center 200 includes a cold aisle 202-A and a hot aisle 202-B. In some embodiments, the cold aisle 202-A and hot aisle 202-B extend on opposite sides of rack computing systems 201 in data center 200. Where rack computing systems 201 are arranged in a row, for example, cold aisle 202-A and hot aisle 202-B may extend in parallel on opposite sides of the row, such that each rack computing system 201 in the row faces each of the aisles on opposite sides. Rack computing system 201 may receive air used for cooling from cold aisle 202-A and exhaust received air that has passed through some or all of rack computing system 201 to hot aisle 202-B. In some embodiments, hot aisle 202-B includes a vent 230, exhaust port, or the like that receives exhaust air 224 that exits the rack computing system 201 into the hot aisle and removes the exhaust air from proximity to rack computing system 201, thereby preventing hot air buildup near the rack computing system 201.

Data center 200 includes a raised floor plenum 208, formed between a raised floor 204 and a lower floor 206, that distributes air supplied by an air handling system 209 through the data center 200 to be supplied to the rack computing system 201 for cooling. Such air 212, referred to hereinafter as "cooling air", is supplied to the cold aisle through one or more floor tiles 210 in the raised floor 204. In some embodiments, one or more floor tiles 210 in the raised floor include one or more flow control elements that can direct the flow of air 212 supplied from plenum 208 through at least a portion of floor tile 210 to one or more particular directions, locations within data center 200, or the like. For example, in the illustrated embodiment, floor tile 210 includes two separate sets of flow control elements 214A-B which can be independently adjusted to manage air flow through tile 210. Flow control element 214-A may control a direction of at least some of the air 212 supplied into cold aisle 202-A, such as towards a particular computing system 203, while flow control element 214-B may control the flow rate of air 212 through some or all of floor tile 210. In another example, each of flow control elements 214A-B can direct air 212 supplied from the plenum 208 along different axes, including perpendicular axes.

In some embodiments, one or more flow control elements include a louver. For example, in the illustrated embodiment, flow control elements 214A-B both include louvers that are rotatable to direct air flow. In some embodiments, one or more of flow control elements 214A-B include one or more flat plates that are slidingly adjustable to direct air flow.

In some embodiments, a floor tile may include a top surface cover that protects flow control elements from damage. For example, floor tile 210 includes a cover 228 above the flow control elements 214A-B. In some embodiments, the cover is configured to cooperate with one or more flow control elements 214A-B to direct the flow of air 212 out of the floor tile 210. For example, in an embodiment where flow control element 214-A includes flat sliding louvers, the cover 208 may include beams, so that the louvers 214-A can slide beneath the beams to restrict air flow, as shown in further detail in FIG. 3. In the embodiment illustrated in FIG. 2, for example, flow control element 214-B includes multiple flat sliding louvers that slide under multiple fixed beams 223 to adjust the flow rate of air through the flow control elements 214-B.

In some embodiments, some or all of a floor tile may be configured to structurally support one or more structural loads. Loads can include dynamic loads, static loads, etc. For example, floor tile 210 may be configured to structurally support the weight of one or more rack computing systems 201. The floor tile 210 may support the weight of some or all of a rack computing system 201 as the rack computing system 201 is moved over some or all of the floor tile 210. The floor tile 210 may support the weight of some or all of a rack computing system 201 as the rack computing system 201 remains in a static position on some or all of the floor tile 210. In some embodiments, particular components of the floor tile 210 support the load. For example, cover 228 may be configured to support the weight of some or all of a rack computing system 201. The cover 228 may transfer the weight to one or more various support structures, such that the flow control elements 214A-B are precluded from having to support such weight.

In some embodiments, one or more flow control elements 214A-B in floor tile 210 may be adjustable by one or more motors 218A-B. For example, in the illustrated embodiment, motor 218-A is coupled to adjust flow control element 214-A and motor 218-B is coupled to adjust flow control element 214-B. In some embodiments, each motor 218A-B may be controlled independently to adjust the flow control elements 214A-B to independent configurations. For example, motor 218-A may rotate flow control element 214-A in a direction towards rack computing system 201, and motor 218-B may rotate flow control element 214-B in a direction perpendicular to rack computer system 201 and along cold aisle 202-A.

In some embodiments, one or more floor tiles are remote-controlled floor tiles 210 that are controllable by a remote control system 220 that can command various adjustments to flow control elements 214A-B in one or more floor tiles 210 by sending independent commands to various motors 218A-B. For example, in the illustrated embodiment, remote control system 220 can send commands to motors 218A-B by way of lines 221 to adjust one or more of flow control elements 214A-B. Commands may be specific to one or more floor tiles 210, one or more flow control elements in one or more tiles 210, or the like so that each remotely-controlled floor tile 210 can be configured independently of other floor tiles 210. In some embodiments, remote control system 220 can control other components to complement control of floor tiles 210, including controlling airflow through plenum 208 by controlling various aspects of air handling unit 209, such as by varying a speed of air-moving unit 226, which can be a variable-speed blower.

In some embodiments, remote control system 220 can adjust one or more flow control elements 214A-B in one or more floor tiles 210, air handling unit 209, and the like based upon environmental data from one or more sensors 222. Such control may be implemented to maintain environmental conditions in data center 200 within acceptable predetermined limits. For example, remote control system 220 may respond to detection of a hotspot in computing system 203-A, based at least in part on data from sensors 222, by commanding one or more of motors 218A-B to adjust one or more flow control elements 214A-B to direct additional air 212 supplied from plenum 208 through at least floor tile 210 towards computing system 203-A to mitigate the hotspot.

In some embodiments, the remote control system 220 may control elements located beyond the raised floor plenum. Remote control system 220 may control exhaust flow control systems. For example, where vent 230 includes one or more flow control elements, remote control system 220 may adjust such flow control elements to one or more various configurations to adjust airflow through the vent 230, upstream of the exhaust vent 230 in the hot aisle 202-B, in the rack computing system 201, in the cold aisle 202-A, in the plenum 208, or the like.

Figure 3:
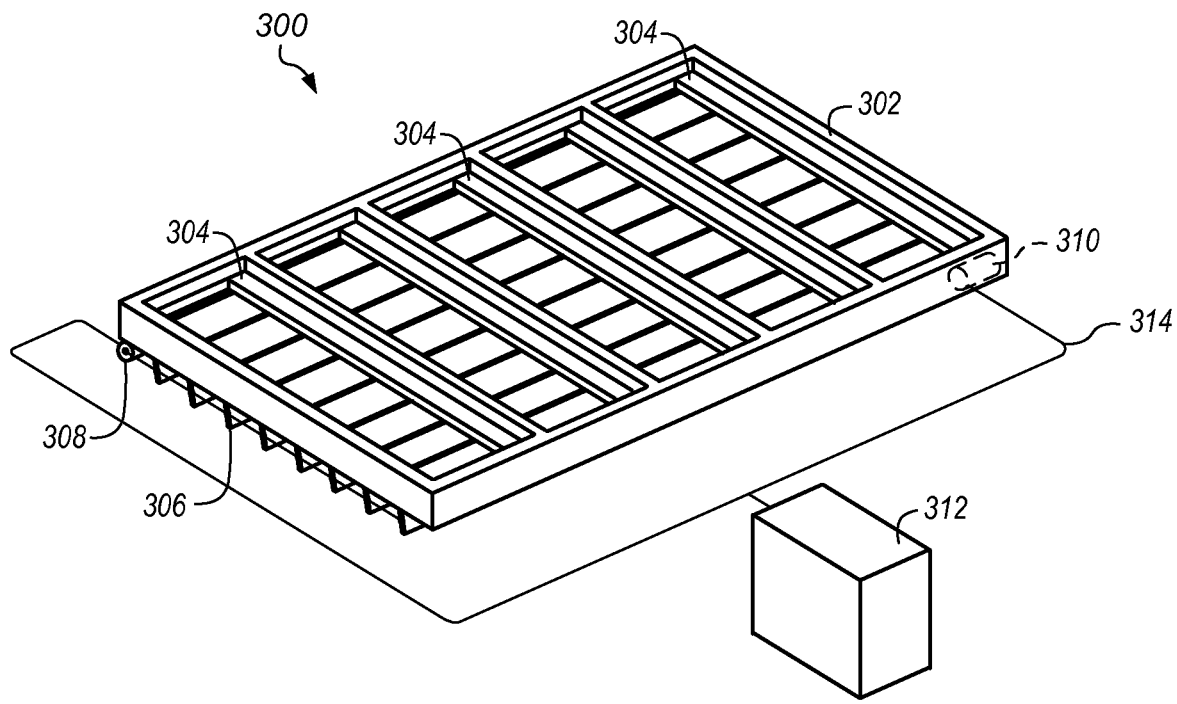
FIG. 3 illustrates a remote-controlled floor tile according to one embodiment.

FIG. 3 illustrates a remote-controlled floor tile according to one embodiment. Floor tile 300 includes a slotted cover 302 that includes various slots to communicate air from a plenum underneath the tile 300 to an environment or region of an environment above the tile. In some embodiments, cover 302 includes one or more various openings to communicate air, including a semi-permeable membrane, one or more perforations, or the like.

Floor tile 300 includes a flow control element that includes multiple flat sliding louvers 304. The louvers 304 can slide under the various slots in cover 302 to adjustably control and direct air flow through tile 300. For example, louvers 304 may be adjusted to direct air flow along a first axis. In another example, louvers 304 may be adjusted to adjust the air flow rate through the tile 300 and may be adjusted to restrict airflow through the tile 300 completely.

Floor tile 300 includes a flow control element that includes multiple rotating louvers 306. The louvers 306 can rotate along one or more axes, including a long axis of the louvers, as shown in the illustrated embodiment, to adjustably control and direct air flow through tile 300. For example, louvers 306 may be adjusted to direct air flow along one or more second axes that may be different from the first axis along with louvers 304 direct air flow. In another example, louvers 306 may be adjusted to adjust the air flow rate through the tile 300 and may be adjusted to restrict airflow through the tile 300 completely.

In some embodiments, various flow control elements are arranged vertically, horizontally, or some combination thereof in the tile 300. For example, in the illustrated embodiment, louvers 304 are stacked above louvers 306 such that air passing through tile 300 is first directed by louvers 306 and then directed by louvers 304.

In some embodiments, floor tile 300 is a remote-controlled tile where one or more flow control elements are adjusted by one or more motors 308-310 based upon signals received from a remote control system 312. For example, in the illustrated embodiment, motor 308 is coupled to flow control element 306, motor 306 is coupled to flow control element 304, and both motors are individually communicatively coupled to remote control system 312 by way of lines 314. Remote control system 312 may independently command each motor 308-310 by sending motor-specific or tile-specific commands to each motor to adjust its respective coupled flow control element independently of other flow control elements.

Figure 4:
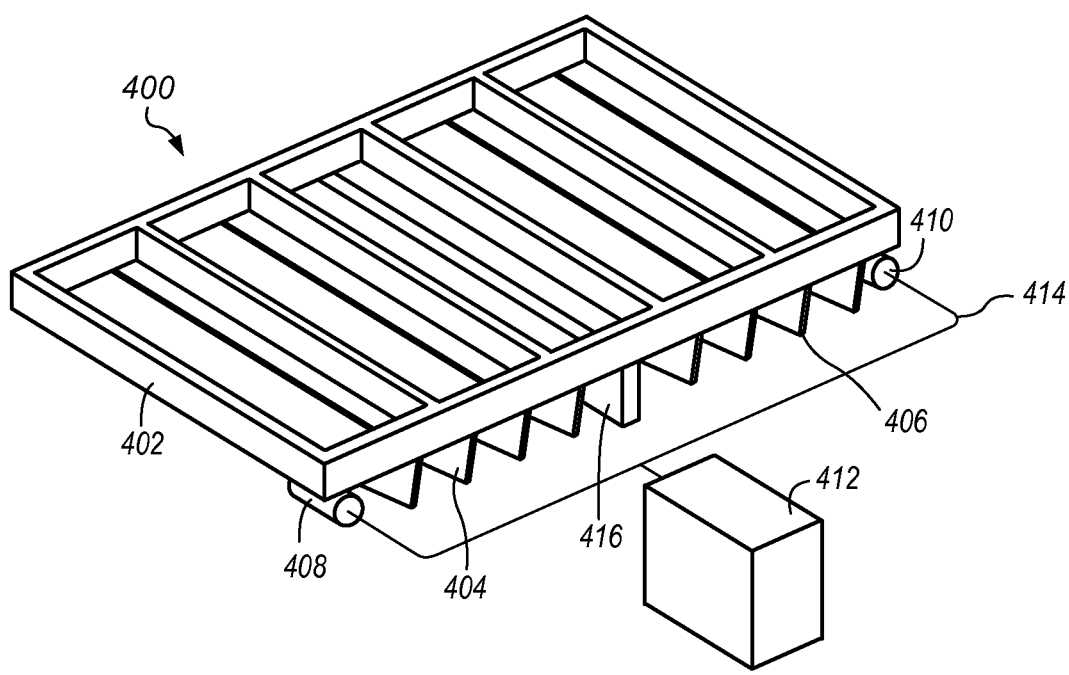
FIG. 4 illustrates a remote-controlled floor tile according to one embodiment.

FIG. 4 illustrates a remote-controlled floor tile according to one embodiment. Floor tile 400 includes a slotted cover 402 that includes various slots to communicate air from a plenum underneath the tile 400 to an environment or region of an environment above the tile. In some embodiments, cover 402 includes one or more various openings to communicate air, including a semi-permeable membrane, one or more perforations, one or more gratings, some combination thereof, etc.

In some embodiments, various flow control elements in floor tile 400 can be arranged horizontally, such that air passing through tile 400 passes through different flow control elements and is therefore directed independently of a configuration of other flow control elements in the floor tile 400. For example, in the illustrated embodiment, floor tile 400 includes two independent flow control elements 404 and 406 that each include multiple rotating louvers. The louvers 404 and 406 are adjustable by respective motors 408 and 410 to rotate along one or more axes, including a long axis of the louvers, as shown in the illustrated embodiment, to independently adjustably control and direct air flow through a portion of tile 400. For example, louvers 404 may be adjusted to direct air flow along one axis, and louvers 406 may be adjusted to direct air flow along one or more second axes that may be different from the first axis. In another example, louvers 404 may be adjusted to adjust the air flow rate through a portion of the tile 400 and may be adjusted to restrict airflow through the portion of tile 400 completely, thereby directing all airflow through louvers 406.

In some embodiments, independent flow control elements are compartmentalized within a floor tile such that air is restricted from passing through only one or more select flow control elements. For example, in the illustrated embodiment, wall element 416 may separate flow control elements 404 and 406, such that air passing through floor tile 400 is restricted to passing through one of the flow control elements 404 and 406, but not the other.

In some embodiments, floor tile 400 is a remote-controlled tile. For example, in the illustrated embodiment, both motors 408 and 410 are individually communicatively coupled to remote control system 412 by way of lines 414. Remote control system 414 may independently command each motor 408, 410 by sending motor-specific or tile-specific commands to each motor to adjust its respective coupled flow control element independently of other flow control elements.

Figure 5:
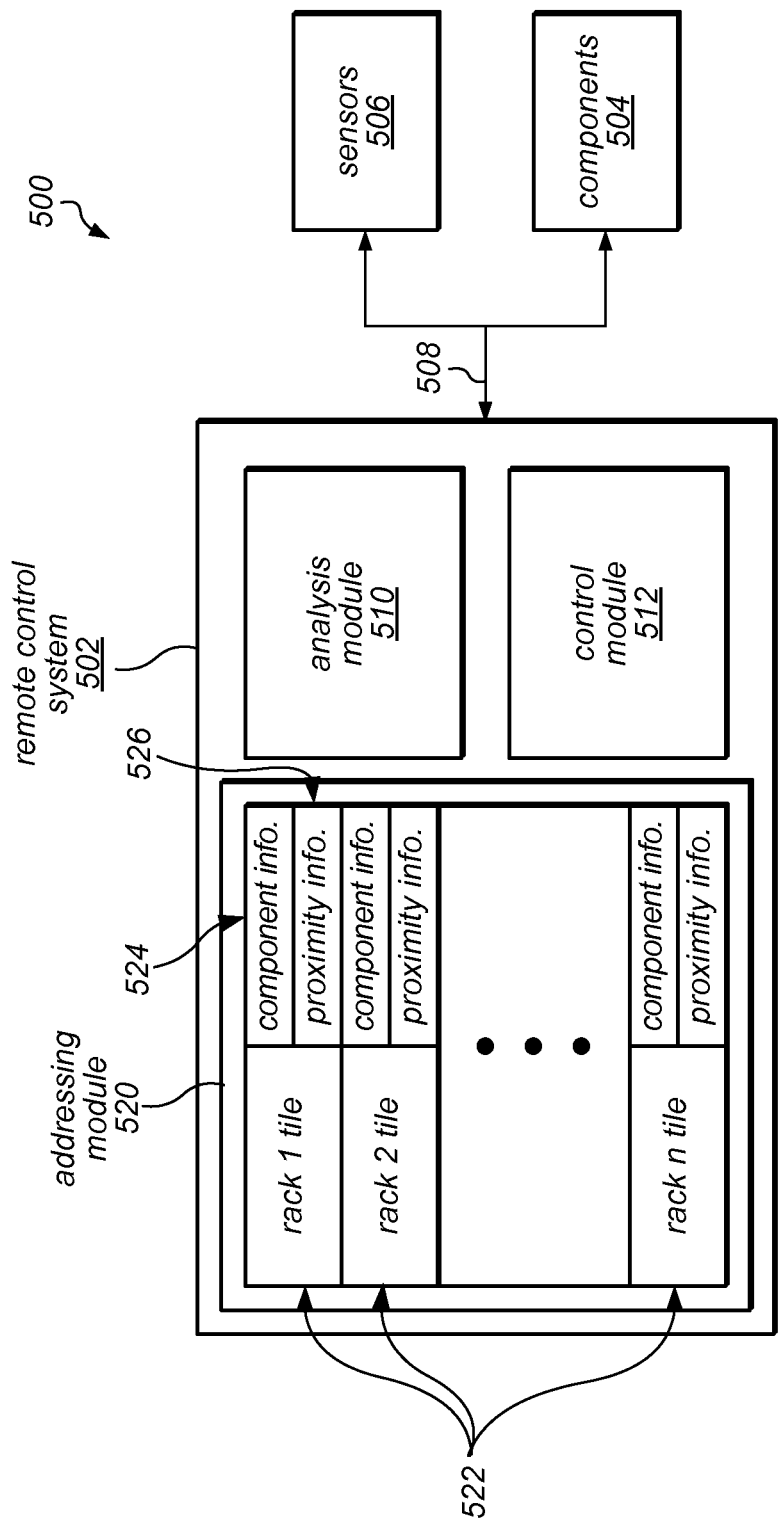
FIG. 5 illustrates a tile remote control system according to one embodiment.

FIG. 5 illustrates a tile remote control system according to one embodiment. In some embodiments, remote-controlled tile system 500 includes one or more of a tile remote control system 502, one or more components 504, and one or more sensors 506. The various illustrated components may be communicatively coupled by way of one or more lines 508. For example, tile remote control system 502 may be communicatively coupled to each of multiple sensors 506 and components 504. The components can include one or more transceivers, computing devices, motors, and the like included in one or more particular remote-controlled floor tiles. The tile remote control system 502 may be communicatively coupled to one or more components in a tile through intermediary components in the tile. For example, tile remote control system 502 may be communicatively coupled to a flow control element in a particular floor tile by way of a communication link with a motor that is coupled to the flow control element.

In some embodiments, tile remote control system 502 can manage various components 504 through remote control. Remote control may involve control through wired communication, wireless communication, or some combination thereof. For example, one or more components 504 may be partially or fully controlled by a tile remote control system 502 that is directly or indirectly communicatively coupled to the floor tile through one or more wired or wireless connections.

In some embodiments, tile remote control system 502 includes one or more of an analysis module 510, a control module 512, and an addressing module 520. Some or all of the modules included in tile remote control system 502 may be implemented by one or more components of one or more computing devices. In some embodiments, some or all of the modules in tile remote control system 502 are communicatively coupled to each other. In some embodiments, individual modules within tile remote control system 502 include individual communication connections to one or more external systems.

In some embodiments, tile remote control system 502 includes analysis module 510 that can monitor environmental data associated with one or more environments to determine whether environmental conditions exceed one or more sets of acceptable limits. Environmental data can be received from one or more sensors 506 continuously, periodically, intermittently, in response to an event trigger, including a query from some part of tile remote control system 502, and the like. In some embodiments, the environmental data includes temperature data associated with various locations in the environment. For example, in a data center environment, the temperature data may include temperatures at various intake, exhaust, and internal points in one or more rack computing systems. In some embodiments, the environmental data includes airflow data associated with various locations in the environment. In some embodiments, environmental data is received from one or more sensor devices, an environmental monitoring system, etc. For example, an environmental monitoring system may include a Building Management System (BMS), an industrial control system including a Supervisory Control and Data Acquisition (SCADA) system, and the like.

In some embodiments, the analysis module 510 can monitor the environmental data for various environmental anomalies. In some embodiments, such monitoring is continuous, periodic, intermittent, based upon one or more trigger events, etc. Various data can be monitored concurrently for various different types of anomalies. For example, in a data center environment, monitoring may include monitoring temperature data to determine whether a hotspot or coldspot is occurring or about to occur at or near one or more rack computing systems by monitoring temperature data. Monitoring may also involve monitoring for anomalies in airflow data, including monitoring for stagnation, back pressure in some or all selected portions of the air distribution system, etc. It will be appreciated that various methods and systems for monitoring environmental data for various environmental anomalies may be known to those having skill in the art and are encompassed by the present disclosure.

In some embodiments, the analysis module 510 can determine, based upon the environmental data, the location of the anomaly with reference to various elements in the environment. For example, in a data center environment, analysis module 510 may determine, based upon environmental data, that a hotspot may occur within a predetermined period of time at a particular computing system in a particular rack computing system in a data center. It will be appreciated that various methods and systems for detecting environmental anomalies and determining their location may be known to those having skill in the art and are encompassed by the present disclosure.

In some embodiments, analysis module 510 can determine one or more various configurations of various components in one or more air distribution systems to manage environmental conditions. For example, where a hotspot at a particular rack computing system is detected based upon environmental data, analysis module 510 may determine one or more various configurations of flow control elements in one or more remote-controlled floor tiles that provides an optimal supply of air to the particular rack computing system to mitigate the hotspot. Determining a desired configuration of a flow control element may involve determining particular adjustments to the flow control element to achieve the desired configuration.

In some embodiments, tile remote control system 502 includes control module 512 that can interact with various external components to manage air distribution in an environment. Such interactions can include controlling one or more flow control elements, air handling units, etc. In some embodiments, control module 512 receives data associated with various components that is used to determine commands directed by the control module 512 to external systems. For example, where a flow control element is coupled to a particular motor, control module 512 may receive data from one or more other modules in tile remote control system 502 identifying the particular motor and providing commands to send to the motor.

In some embodiments, control module 512 implements a configuration of flow control elements in an environment as determined by analysis module 510. For example, where analysis module 510 determines a certain desired configuration of flow control elements in one or more remote-controlled floor tiles to mitigate a hotspot, control module 512 can send commands to various components directing adjustment of the flow control elements to arrive at the optimal configuration. Such commands may be command signals sent to various flow control elements, motors, transceivers, or the like. Independent commands specific to one or more tiles, flow control elements, or the like may be sent, such that each tile or flow control element receives an independent command and adjusts one or more flow control elements independently of some or all other flow control elements.

In some embodiments, tile remote control system 502 includes addressing module 520 that can maintain a database of entries associated with remote-controlled floor tiles in system 500. Each entry may include various information associated with one or more particular floor tiles, including information associated with flow control elements, motors, etc. and various additional information associating each floor tile, or components therein, with various other components in an environment.

For example, in the illustrated embodiment, addressing module 520 includes entries 522 for a number of floor tiles. Each illustrated entry 522 includes various information regarding a given floor tile, including information 524 identifying various flow control elements, coupled motors, etc. in the floor tile. Such information 524 may include directional adjustment ranges associated with various flow control elements, variable air flow rate capabilities provided by flow control elements, and communication address information that can be used by control module 512 to communicate with particular components in a floor tile, such as a particular motor coupled to a particular flow control element.

Each entry in the database may include information 526 that associates a given floor tile with other components in a system external to the floor tile. For example, where a floor tile is one of many floor tiles in a data center, information 526 may identify a particular rack computing system adjacent to the given floor tile, such that the floor tile is associated or assigned to the particular rack computing system. In some embodiments, a particular floor tile may be identified from a search of the database based upon an associated rack computing system.

In some embodiments, information 526 may identify a particular floor tile with reference to some or all other components in the room, so that the floor tile may be prioritized or selected for being adjusted into a new configuration based upon proximity to one or more various components. Associations may have varying levels of priority based upon characteristics of the floor tiles, rack computing systems, proximity between same, and the like, such that a given floor tile may have a different priority with regard to various rack computing systems, floor tiles, etc. in a data center. In some embodiments, information 526 includes priority rules, such that a given floor tile, flow control element may be assigned a priority, ranking with respect to other floor tiles, flow control elements, etc. based upon various criteria, such as proximity to a portion of a particular rack computing system, amount of air required by the portion, etc.

In some embodiments, analysis module 510 may, as part of determining a configuration of one or more floor tiles or components therein, interact with tile addressing module 520 to identify various floor tiles, flow control elements, motors, etc. to adjust to achieve the configuration. For example, where a new configuration must provide additional air to a particular rack computing system experiencing a hotspot, analysis module may interact with addressing module 520 to identify, prioritize, rank, etc. various floor tiles, flow control elements, or some combination thereof with regard to the criteria, and then select various flow control elements, along with determining particular configurations of the flow control elements, and provide information to control module 512 to send appropriate signals to appropriate components to implement the desired configuration.

For example, where tile entries 522 include priority rules regarding various portions of rack computing systems, a floor tile that is adjacent to a particular rack computing system may be assigned a high priority based upon proximity to the rack computing system, nearby floor tiles may be assigned an intermediate priority based upon relative proximity and line of sight to a particular computing system in the rack computing system experiencing the hotspot, and more distant floor tiles may be assigned a low priority. Identification may involve identifying only those floor tiles having at least an intermediate priority with regard to the portion of the rack computing system experiencing the hotspot.

In some embodiments, entries 522 for floor tiles, information 524 and 526 included therein, or some combination thereof are created by addressing module 520 based at least in part on from user input through a user interface. For example, when a floor tile is added to a data center environment, such as if a new rack computing system is added, a user may interact with a user interface, which may be coupled to tile remote control system 502, to add an entry 522 in a database included with addressing module 520 and various information 524 and 526 so that the tile and various components therein can be identified through a search of the database.

In some embodiments, entries 522 for floor tiles, information 524 and 526 included therein, or some combination thereof are created by addressing module 520 based upon interaction between some part of tile remote control system 502 and one or more various components 504 in an environment. For example, where various floor tiles in a data center are communicatively coupled to a network, each tile may provide address information regarding itself and various components therein, such as flow control elements, motors, etc. to the network upon being added to the network, such that tile remote control system 502 may receive such address information when a new floor tile is added or replaces an old floor tile. In response to detection of a new floor tile in the network, addressing module 520 may create a new entry 522 for the new tile based upon information collected from the new tile over the network. In addition, removal or absence of a tile may be noted by addressing module 520, which may remove one or more entries 522, send a notification to one or more systems or users via various interfaces, etc.

Figure 6:
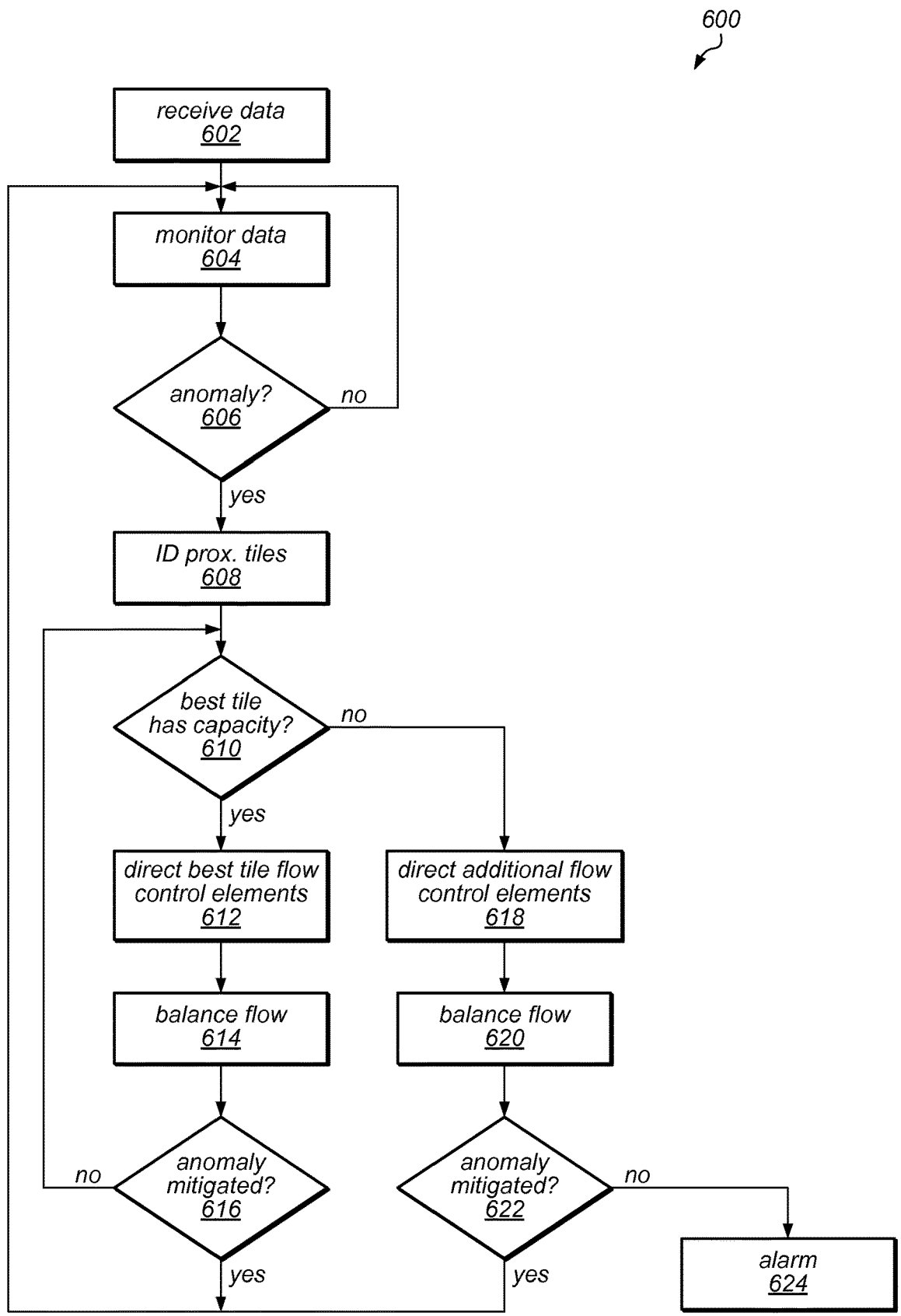
FIG. 6 illustrates managing floor tile configurations to mitigate environmental anomalies in an environment according to one embodiment.

FIG. 6 illustrates managing floor tile configurations 600 to mitigate environmental anomalies in an environment according to one embodiment. In some embodiments, the control system implementing such management is associated with a computing room in a data center.

At 602, environmental data associated an environment is received. In some embodiments, the environment is a room where a raised floor plenum is configured to supply air to one or more regions in the room. For example, in a data center where a raised floor plenum is configured to supply cooling air to rack computing systems, the environment may include a computing room including one or more rows of rack computing systems supplied with air from one or more cold aisles, where cooling air is supplied to the cold aisles from the plenum through one or more floor tiles. In such an environment, one or more of the floor tiles may be remote-controlled floor tiles that can be independently adjusted to selectively deliver cooling air to various regions in the room, including selected computing systems, to maintain environmental conditions within certain predetermined limits.

In some embodiments, the environmental data includes temperature data associated with various locations in the environment. In a data center, the temperature data may include temperatures at various intake, exhaust, and internal points in one or more rack computing systems. In some embodiments, the environmental data includes airflow data associated with various locations in the environment. In some embodiments, environmental data is received from one or more sensor devices, an environmental monitoring system, etc. For example, an environmental monitoring system may include a Building Management System (BMS), an industrial control system including a Supervisory Control and Data Acquisition (SCADA) system, and the like. It will be appreciated that various methods and systems for receiving environmental data may be known to those having skill in the art and are encompassed by the present disclosure.

At 604, the environmental data is monitored for anomalies. In some embodiments, such monitoring is continuous, periodic, intermittent, based upon one or more trigger events, etc. It will be appreciated that various methods and systems for monitoring environmental data for various environmental anomalies may be known to those having skill in the art and are encompassed by the present disclosure.

At 606, a determination is made whether an environmental anomaly is detected based upon the monitored environmental data. If so, an environmental anomaly is identified. In some embodiments, the anomaly is a temperature anomaly. For example, in a data center environment, an environmental anomaly may be a temperature value associated with a particular rack computing system that is determined to have exceeded a high-temperature threshold such that a hotspot is identified at the particular rack computing system. In some embodiments, an environmental anomaly is an airflow anomaly. For example, in a data center environment, an environmental anomaly may be an airflow value associated with a particular location in the data center that is determined to have fallen below a low-flow threshold such that stagnation is identified at the particular location.

In some embodiments, the identified anomaly can be associated with a particular location or region in the environment. For example, in a data center environment, where an identified anomaly is a temperature hotspot, the hotspot may be associated with a particular computing system in a rack computing system, a particular part of a particular rack computing system, etc. It will be appreciated that various methods and systems for detecting environmental anomalies and determining their location may be known to those having skill in the art and are encompassed by the present disclosure.

If no anomalies are identified, monitoring continues. In some embodiments, at least some monitoring continues even if one or more anomalies are detected.

At 608, upon detection of an anomaly, remote-controlled floor tiles in the environment are identified based upon proximity to the anomaly. For example, in a data center environment where the anomaly is a localized hotspot in a particular rack computing system, one or more floor tiles adjacent or within a certain distance of the particular rack computing system are identified. In some embodiments, identification involves consulting a database of floor tiles, where entries for each floor tile are addressed based upon location in the environment, and identifying one or more floor tiles that meet certain criteria with respect to the hotspot, including a certain proximity to the hotspot. For example, identification may involve identifying only a floor tile that is adjacent to the particular rack computing system.

In another example, where tile entries include priority rules regarding various portions of rack computing systems, an adjacent floor tile may have a high priority based upon proximity to the rack computing system, nearby floor tiles may have an intermediate priority based upon relative proximity and line of sight to a particular computing system in the rack computing system experiencing the hotspot, and more distant floor tiles may have a low priority, identification may involve identifying only those floor tiles having at least an intermediate priority with regard to the portion of the rack computing system experiencing the hotspot.

Identifying remote-controlled floor tile may include identifying specific flow control elements, motors coupled to some, or some combination thereof. For example, where an identified nearby floor tile includes two flow control elements that can direct air along two different perpendicular axes, identifying the nearby floor tile may include identifying particular flow control elements that could be adjusted to direct air towards the hotspot, adjust flow rate through the tile, and the like. In some embodiments, only some of the flow control elements in an identified tile are identified. For example, where a nearby floor tile includes a first flow control element that can direct air towards the hotspot and a second flow control element that cannot be adjusted, alone or in concert with another flow control element, to direct air towards the hotspot or adjust air flow rate towards the hotspot, only the first flow control element and associated motor is identified.

In some embodiments, identifying proximate tiles includes identifying a "best" floor tile that can be adjusted to provide the most optimal configuration of floor tiles to mitigate the hotspot. Such an identification can be based upon relative priorities assigned to various floor tiles. For example, where floor tiles are prioritized based upon proximity to the hotspot, the nearest floor tile may have the highest priority and may therefore be identified as the best floor tile.

At 610, a determination is made regarding whether the identified best floor tile can be configured to provide additional air to a target location associated with the environmental anomaly. For example, where the anomaly is a hotspot in a particular computing system of a rack computing system, the determination may involve determining whether the flow control elements in the best floor tile can be adjusted to a new configuration to provide additional air to the particular computing system.

In some embodiments, the new configuration may include a particular adjustment of one or more flow control elements in the best floor tile to direct air to a specific target. For example, where a hotspot is associated with a particular portion of a particular rack computing system, including a particular air intake, the new configuration may include a particular adjustment of one or more flow control elements to direct air supplied from the plenum to the particular portion.

If, at 612, the best floor tile's flow control elements can be adjusted into a new configuration that provides additional air to mitigate the anomaly, such an adjustment is commanded. Commanding the adjustment may involve commanding one or more motors to adjust one or more flow control elements in the best tile into a new configuration to direct air to a target location to mitigate the identified hotspot. Such a commanding may involve sending command signals to one or more motors, providing electrical power to power one or more motors, or some combination thereof.

At 614, various components in one or more air distribution systems are adjusted to balance the supply of air to the environment. In some embodiments, one or more air handling units may be commanded to increase or decrease airflow through one or more raised floor plenums, fixed ducts, etc. to maintain environmental parameters within a certain range. For example, in a data center environment, adjusting one or more flow control elements in a best raised floor tile to direct additional air to a rack computing system may affect airflow throughout a raised floor plenum, such that an air handling unit for the raised floor plenum is directed to increase or reduce airflow through the raised floor plenum. Air handling units may be commanded to change airflow by commanding one or more control units to vary the speed of air moving device, such as a blower, in an air handling unit using a variable frequency drive.

In some embodiments, one or more flow control elements may be commanded to be adjusted to adjust air flow through the best floor tile. For example, floor tiles of low priority with regard to the hotspot that are determined to be providing excess cooling air to one or more rack computing systems may be commanded to be adjusted to reduce airflow through those floor tiles, so that air flow rate through the best floor tile to the hotspot is maintained, even with an increased flowrate of air through the best floor tile.

At 616, the environmental data is monitored to determine if the environmental anomaly is mitigated. In some embodiments, mitigation is determined based upon one or more environmental parameters associated with a region crossing a certain threshold. For example, in a data center environment, a hotspot may be determined to be mitigated at a rack computing system if temperature values association with at least a portion of the rack computing system fall below a certain threshold, which may be the same or different from a high-temperature threshold that triggers a hotspot identification.

If the hotspot is mitigated, monitoring continues. In some embodiments, one or more flow control elements are adjusted to a new configuration upon hotspot mitigation to reduce the amount of air directed to the region where the hotspot was formerly located. In some embodiments, the flow control elements are left in their present configuration until another anomaly is detected.

If, as shown at 616 and 610, the anomaly is not mitigated, the best floor tile is re-considered to determine if any additional air can be directed from the best floor tile to mitigate the hotspot.

If, as shown at 618, the anomaly is not mitigated and no additional air can be directed to mitigate the anomaly from the "best" floor tile, additional flow control elements are commanded to be adjusted to direct air to mitigate the anomaly. For example, where floor tiles are prioritized based upon proximity to a hotspot, and a nearest floor tile is determined to be the "best" floor tile, other floor tiles that are within a certain distance of the hotspot may be identified as medium-priority floor tiles, such that flow control elements in one or more of the medium priority floor tiles are commanded to be adjusted at 618.

At 620, various components in one or more air distribution systems are adjusted to balance the supply of air to the environment, similarly to at 614. At 622, the environmental data is monitored to determine if the environmental anomaly is mitigated, similarly to 616. If the hotspot is mitigated, monitoring continues.

If, as shown at 624, the anomaly is not mitigated, an alert indication is provided. In some embodiments, an alert comprises sending an indication to an operator of the existence of an anomaly that was not mitigated. The alert indication may indicate the specific region, associated elements, and environmental parameters associated with the anomaly. For example, in a data center environment, the alert indication may identify a specific rack computing system experiencing a hotspot, as well as an indication of the current temperature, estimated time until the rack computing system must shut down due to the hotspot, etc. The operator may implement additional mitigation functions to mitigate the anomaly. For example, in a data center environment, where configuration of a mobile soft duct system fails to mitigate a hotspot, an operator may be informed of the hotspot so that additional mitigation steps can be taken, such as introducing a fan apparatus near the rack computing system experiencing the hotspot to deliver additional air, removing a floor tile to deliver additional air, and the like.

In some embodiments, managing tile configurations 600 excludes directing additional louvers. For example, in some embodiments, upon identifying an anomaly at 606, a proximate floor tile may be identified at 608, and one or more flow control elements of the proximate floor file may be directed at 612, and, if the anomaly is determined to not be mitigated at 616, an alert indication may be provided at 624.

Figure 7:
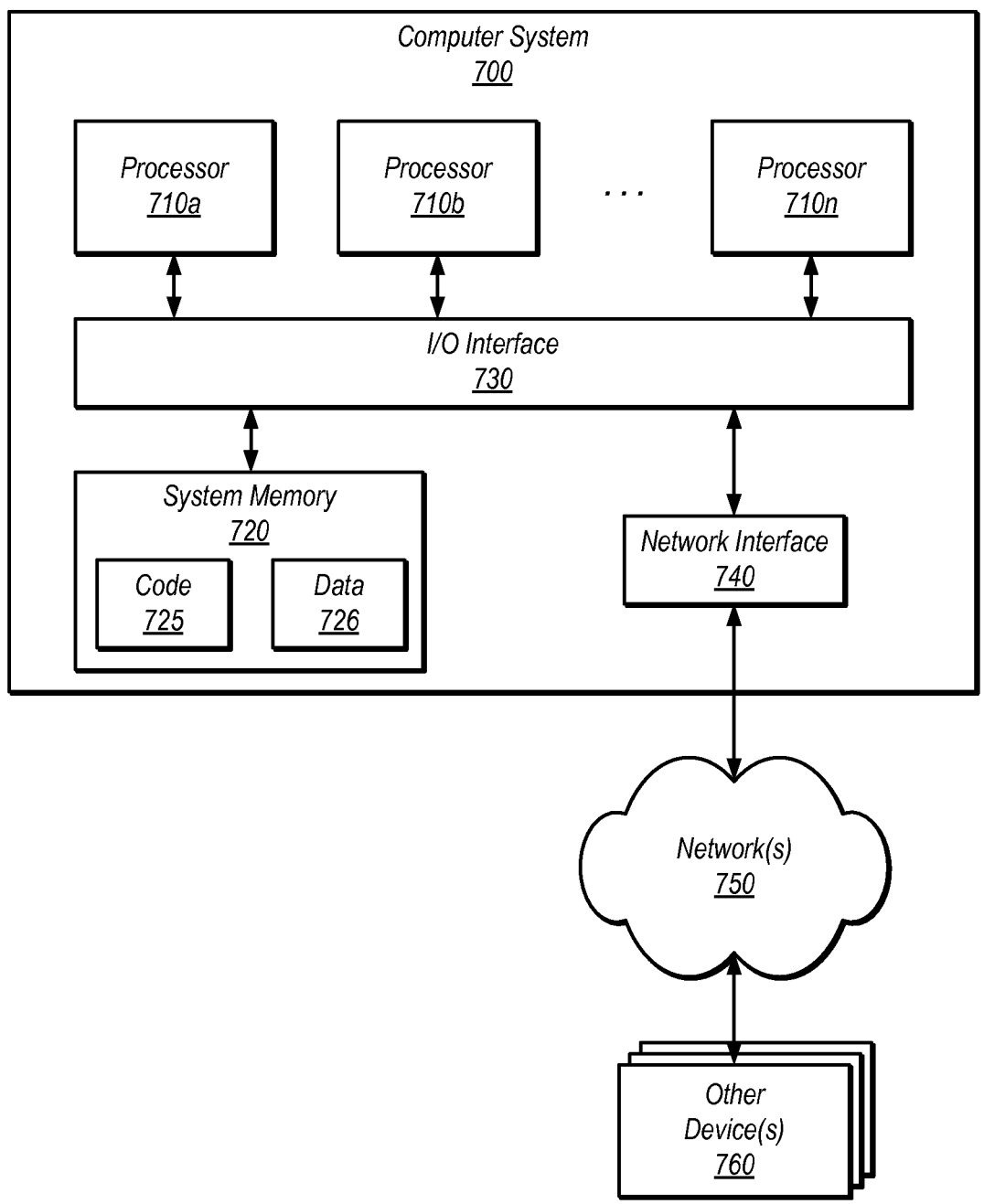
FIG. 7 is a block diagram illustrating an example computer system that may be used in some embodiments.

FIG. 7 is a block diagram illustrating an example computer system that may be used in some embodiments.

In some embodiments, a system that implements a portion or all of one or more of the technologies, including but not limited to a portion or all of the remote-controlled floor tile system, one or more remote-controlled floor tiles, a remote control system, one or more modules included in the remote control system, and air distribution management methods, systems, devices, and apparatuses as described herein, may include a general-purpose computer system that includes or is configured to access one or more computer-accessible media, such as computer system 700 illustrated in FIG. 7. In the illustrated embodiment, computer system 700 includes one or more processors 710 coupled to a system memory 720 via an input/output (I/O) interface 730. Computer system 700 further includes a network interface 740 coupled to I/O interface 730.

In various embodiments, computer system 700 may be a uniprocessor system including one processor 710, or a multiprocessor system including several processors 710 (e.g., two, four, eight, or another suitable number). Processors 710 may be any suitable processors capable of executing instructions. For example, in various embodiments, processors 710 may be general-purpose or embedded processors implementing any of a variety of instruction set architectures (ISAs), such as the x86, PowerPC, SPARC, or MIPS ISAs, or any other suitable ISA. In multiprocessor systems, each of processors 710 may commonly, but not necessarily, implement the same ISA.

System memory 720 may be configured to store instructions and data accessible by processor(s) 710. In various embodiments, system memory 720 may be implemented using any suitable memory technology, such as static random access memory (SRAM), synchronous dynamic RAM (SDRAM), nonvolatile/Flash-type memory, or any other type of memory. In the illustrated embodiment, program instructions and data implementing one or more desired functions, such as a portion or all of the remote-controlled floor tile system, one or more remote-controlled floor tiles, a remote control system, one or more modules included in the remote control system, and air distribution management methods, systems, devices, and apparatuses as described herein, are shown stored within system memory 720 as code 725 and data 726.

In one embodiment, I/O interface 730 may be configured to coordinate I/O traffic between processor 710, system memory 720, and any peripheral devices in the device, including network interface 740 or other peripheral interfaces. In some embodiments, I/O interface 730 may perform any necessary protocol, timing or other data transformations to convert data signals from one component (e.g., system memory 720) into a format suitable for use by another component (e.g., processor 710). In some embodiments, I/O interface 730 may include support for devices attached through various types of peripheral buses, such as a variant of the Peripheral Component Interconnect (PCI) bus standard or the Universal Serial Bus (USB) standard, for example. In some embodiments, the function of I/O interface 730 may be split into two or more separate components, such as a north bridge and a south bridge, for example. Also, in some embodiments some or all of the functionality of I/O interface 730, such as an interface to system memory 720, may be incorporated directly into processor 710.

Network interface 740 may be configured to allow data to be exchanged between computer system 700 and other devices 760 attached to a network or networks 750, such as other computer systems or devices as illustrated in FIGS. 1 through 6, for example. For example, network interface 740 may be configured to allow data to be exchanged between computer system and one or more sensor devices, a sensor management system, some or all of the remote-controlled tile system, or the like. In various embodiments, network interface 740 may support communication via any suitable wired or wireless general data networks, such as types of Ethernet network, for example. Additionally, network interface 740 may support communication via telecommunications/telephony networks such as analog voice networks or digital fiber communications networks, via storage area networks such as Fibre Channel SANs, or via any other suitable type of network and/or protocol.

In some embodiments, system memory 720 may be one embodiment of a computer-accessible medium configured to store program instructions and data for implementing embodiments of air distribution management methods as described above relative to FIGS. 1-6. In other embodiments, program instructions and/or data may be received, sent or stored upon different types of computer-accessible media. Generally speaking, a computer-accessible medium may include non-transitory storage media or memory media such as magnetic or optical media, e.g., disk or DVD/CD coupled to computer system 700 via I/O interface 730. A non-transitory computer-accessible storage medium may also include any volatile or non-volatile media such as RAM (e.g. SDRAM, DDR SDRAM, RDRAM, SRAM, etc.), ROM, etc., that may be included in some embodiments of computer system 700 as system memory 720 or another type of memory. Further, a computer-accessible medium may include transmission media or signals such as electrical, electromagnetic, or digital signals, conveyed via a communication medium such as a network and/or a wireless link, such as may be implemented via network interface 740.

Various embodiments may further include receiving, sending or storing instructions and/or data implemented in accordance with the foregoing description upon a computer-accessible medium. Generally speaking, a computer-accessible medium may include storage media or memory media such as magnetic or optical media, e.g., disk or DVD/CD-ROM, volatile or non-volatile media such as RAM (e.g. SDRAM, DDR, RDRAM, SRAM, etc.), ROM, etc., as well as transmission media or signals such as electrical, electromagnetic, or digital signals, conveyed via a communication medium such as network and/or a wireless link.

The various methods as illustrated in the Figures and described herein represent example embodiments of methods. The methods may be implemented in software, hardware, or a combination thereof. The order of method may be changed, and various elements may be added, reordered, combined, omitted, modified, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A data center comprising:
   a row of rack computing systems, each rack computing system comprising a respective rack and one or more respective computer systems;
   a cold aisle extending along the row of rack computing systems, such that each of the rack computing systems faces the cold aisle on an intake side and is configured to receive air from the cold aisle;
   a raised floor plenum extending beneath the cold aisle, the raised floor plenum configured to supply air to the cold aisle; and a remote-controlled floor tile system configured to direct air supplied from the raised floor plenum to the rack computing systems, the remote-controlled floor tile system comprising:
a plurality of remote-controlled louver tiles located in the cold aisle, each of the remote-controlled louver tiles comprising a corresponding adjustable louver configured to direct air supplied from the raised floor plenum to at least one of the rack computing systems by adjusting a direction of air flow exiting the raised floor plenum; and
a tile remote control system configured to:
receive, at the tile remote control system, corresponding environmental data for each respective location of a plurality of locations, the corresponding environmental data collected by respective sensors proximate to the respective locations, wherein each location is proximate to a different corresponding rack computing system;
detect that the corresponding environmental data for a particular location crosses a corresponding threshold;
responsive to the detection, selectively rotate a particular louver in a direction toward the particular location to direct additional air in or near a particular one of the rack computing systems proximate to the particular location, wherein said particular louver is configured to direct air along a particular direction selected by adjustment; and
after the particular louver is rotated responsive to the detection, responsive to detection that additional environmental data for the particular location crosses the corresponding threshold rotate another louver of another remote-controlled louver tile toward the particular location, wherein said other louver is configured to direct air along a different direction selected by adjustment independent of the particular direction.

2. The data center of claim 1, comprising:
a plurality of rack temperature sensors configured to provide rack temperature data associated with locations proximate to the rack computing systems; and
wherein the tile remote control system is configured to selectively adjust the particular louver in response to a determination, based at least in part on the rack temperature data, that a rack temperature associated with a particular rack computing system exceeds a threshold value, such that after adjusting the particular louver additional intake air is supplied to the particular rack computing system.

3. The data center of claim 1, comprising:
a plurality of tile airflow sensors configured to provide tile airflow data associated with locations proximate to the remote-controlled louver tiles; and
wherein the tile remote control system is further configured to, in response to selectively adjusting the particular louver, and based at least in part on the tile airflow data, selectively adjust a separate particular louver, such that after adjusting the separate particular louver an air flow rate associated with the particular louver is changed.

4. The data center of claim 1, wherein the tile remote control system comprises:
a computing device communicatively coupled to the remote-controlled louver tiles; and
wherein the computing device is configured to command a particular configuration of a particular remote-controlled louver tile independent of a remainder of the remote-controlled louver tiles, such that the particular remote-controlled louver tile is independently configured to direct air to a particular rack computing system.

5. The data center of claim 4, wherein:
to command the particular configuration, the computing device is configured to selectively command individual configurations of the particular louver and the other louver to direct air to the particular rack computing system.

6. The data center of claim 4, wherein, to command the particular configuration, the computing device is further configured to:
identify the particular remote-controlled louver tile from a directory of remote-controlled louver tiles based at least in part upon a proximity of the particular louver tile to the particular rack computing system.

7. The data center of claim 4, wherein, to command the particular configuration, the computing device is configured to:
determine a temperature value associated with the particular rack computing system based at least in part on temperature data received from at least one temperature sensor;
in response to a determination that the temperature value exceeds a high-temperature threshold, detect a temperature hotspot in the particular rack computing system; and
wherein the computing device is configured to command the particular configuration of the particular remote-controlled louver tile, independent of the remainder of the remote-controlled louver tiles, in response to detecting the temperature hotspot in the particular rack computing system.

8. The data center of claim 7, wherein the computing device is configured to receive the temperature data from at least one of a building management system (BMS) or a Supervisory Control and Data Acquisition (SCADA) system associated with the data center.

9. The data center of claim 4, wherein the computing device is further configured to command a configuration of another remote-controlled louver tile to control a flow rate of air supplied through the particular remote-controlled louver tile.

10. The data center of claim 4, wherein the computing device is communicatively coupled to at least a portion of the remote-controlled louver tiles through a wireless connection.

11. The data center of claim 1, wherein a particular one of the remote-controlled louver tiles comprises:
a data center floor tile configured to be coupled to the raised floor plenum in the data center, such that the data center floor tile is configured to supply air from the raised floor plenum to the row of rack computing systems, the data center floor tile comprising:
an interface communicatively coupled to the tile remote control system;
a motor coupled to the particular louver, the motor configured to adjust the particular louver based at least in part on a command signal received at the interface from the tile remote control system.

12. The data center of claim 11, wherein:
the data center floor tile is configured to be included in a network of floor tiles that are each communicatively coupled to the tile remote control system; and
wherein the command signal is a tile-specific command signal that is specific to the data center floor tile in the network of floor tiles, such that the motor is configured to adjust the particular louver to a configuration independent of flow control element configurations in a remainder of the network of floor tiles based at least in part on the tile-specific command signal.

13. The data center of claim 11, wherein:
the particular louver is configured to direct air along the particular direction; and
the data center floor tile further comprises a different louver configured to direct air along a different direction.

14. The data center of claim 11, wherein the data center floor tile comprises a perforated floor tile including a plurality of perforations configured to direct air supplied from the raised floor plenum to at least one of the rack computing systems.

15. The data center of claim 11, wherein the interface is communicatively coupled to the tile remote control system through a wireless connection.

16. The data center of claim 1, wherein the tile remote control system is further configured to:
receive other environmental data; and
determine, based at least in part on a comparison of the other environmental data received to the corresponding threshold, whether to maintain the selected rotation of the particular louver so as to direct air to the particular rack computing system proximate to the particular location.

* * * * *